United States Patent [19]
Vlahu

[11] Patent Number: 5,912,638
[45] Date of Patent: Jun. 15, 1999

[54] DIRECT RESOLVER TO DIGITAL CONVERTER

[75] Inventor: Saso P. Vlahu, Munster, Ind.

[73] Assignee: Kollmorgen Corporation, Waltham, Mass.

[21] Appl. No.: 08/853,930

[22] Filed: May 9, 1997

[51] Int. Cl.$^6$ .................................................. H03M 1/48
[52] U.S. Cl. ........................................... 341/116; 341/115
[58] Field of Search .................... 364/729, 730, 364/724.2, 728.02, 716.02; 395/737, 739; 318/254, 439, 701, 696; 341/115, 116

[56] References Cited

U.S. PATENT DOCUMENTS

| | | | |
|---|---|---|---|
| 3,578,959 | 5/1971 | Perkins et al. | 235/152 |
| 3,827,045 | 7/1974 | Markus | 340/347 |
| 3,829,854 | 8/1974 | Brand et al. | 340/347 |
| 3,908,896 | 9/1975 | Monrolin | 235/152 |
| 4,511,884 | 4/1985 | Serev et al. | 340/347 |

OTHER PUBLICATIONS

Electronic Analog/Digital Conversions, Hermann Schmid, General Electric Company, Avionic Controls Department, Binghamton, New York, Mar. 1970.

*Primary Examiner*—Ayaz R. Sheikh
*Assistant Examiner*—Tim Vo
*Attorney, Agent, or Firm*—Morgan & Finnegan

[57] ABSTRACT

A resolver to digital converter wherein the data from the resolver is processed according to octants which provide the most significant three bits indicating shaft position. The sine and cosine values from the resolver are further processed according to the octant with the smaller value being divided by the larger value to derive a tangent value in the range of zero to one. A look up table can then be used to provide a linear position indication from the tangent values which are then added to the octant value to obtain the shaft position indication.

7 Claims, 6 Drawing Sheets

OCTANTS TABLE

|     | SIN+ | COS+ | \|SIN\| > \|COS\| | OCTANT |
|-----|------|------|-------------------|--------|
| I   | 1    | 1    | 0                 | 000    |
| II  | 1    | 1    | 1                 | 001    |
| III | 1    | 0    | 1                 | 010    |
| IV  | 1    | 0    | 0                 | 011    |
| V   | 0    | 0    | 0                 | 100    |
| VI  | 0    | 0    | 1                 | 101    |
| VII | 0    | 1    | 1                 | 110    |
| VIII| 0    | 1    | 0                 | 111    |

FIG. 3A

DIVISION TABLE

|      | LARGER | SMALLER |
|------|--------|---------|
| I    | COS    | SIN     |
| II   | SIN    | COS     |
| III  | SIN    | COS     |
| IV   | COS    | SIN     |
| V    | COS    | SIN     |
| VI   | SIN    | COS     |
| VII  | SIN    | COS     |
| VIII | COS    | SIN     |

DIRECT RESOLVER TO DIGITAL CONVERTER

BACKGROUND OF THE INVENTION

Resolvers are used extensively in motor control systems to provide angular position and velocity feedback. Generally, the resolver includes a primary winding energized from a carrier frequency source and includes a pair of relatively rotatable secondary windings positioned in a quadrature relationship. The secondary windings provide signals at the carrier frequency with an amplitude envelope corresponding to sine θ and cosine θ, respectively, where θ is the angular position of the resolver shaft. The signals are then demodulated to remove the carrier and recover the amplitude envelope. The sine θ and cosine θ signal values are then processed to determine the angle θ which is the shaft position. The advantages of the resolver over other types of position indicators are relatively low cost, virtually unlimited resolution provided by the continuous analog signals and immunity from most stress and vibration problems.

Resolver to digital processors are available which convert resolver analog signals to a digital values representing the angular shaft position θ. Such processors usually provide a digital shaft angle representation and an analog velocity indication. Among the disadvantages of the prior processes are relatively poor digital resolution (particularly at high speeds) and limited tracking error tolerance. The phase relationship between the modulating source and the modulated feedback to provide the sine and cosine values is critical and often requires special cables. Also, such systems have limited noise rejection.

SUMMARY OF THE INVENTION

An object of the present invention is to provide a low cost resolver to digital converter which can be constructed using readily available components. Another object is to provide a resolver to digital converter which provides both position and velocity data in a high-resolution digital format.

In the resolver to digital converter according to the invention the sine θ and cosine θ signals provided by the resolver are demodulated to remove the carrier and then converted to digital values which are stored in memory associated with a conventional microprocessor. The sine and cosine values are compared to determine the octant for the angle θ. The octant is determined on the basis of the polarity of the sine and cosine signals and by determining whether or not the sine value has a larger absolute value than the cosine value. The octant determination provides the three most significant bits indicating the shaft position.

The sine and cosine values are further processed according to the octant position. The smaller absolute value is divided by the larger value to derive a tangent θ value in the range of 0 to 1.0. The tangent θ value is close to linear with a deviation of less than 7% maximum and therefore provides relatively uniform resolution throughout the range. The tangent θ values are then converted to linear values using a look-up table.

The corrected tangent values are then inverted for odd octants and thereafter added to the octant values to provide the shaft angle position. With these values, and assuming a sampling rate on the order of 1 millisecond, the velocity can be determined digitally as the difference in value between two successive angle position samples.

BRIEF DESCRIPTION OF THE DRAWINGS

The foregoing and other objects are achieved according to a preferred embodiment of the invention as described in the following drawings which are part of the specification.

FIG. 3A is a table used to determine the octants and FIG. 3B is a table used in determining tangent values.

DETAILED DESCRIPTION OF THE PREFERRED EMBODIMENTS

Figure 1:
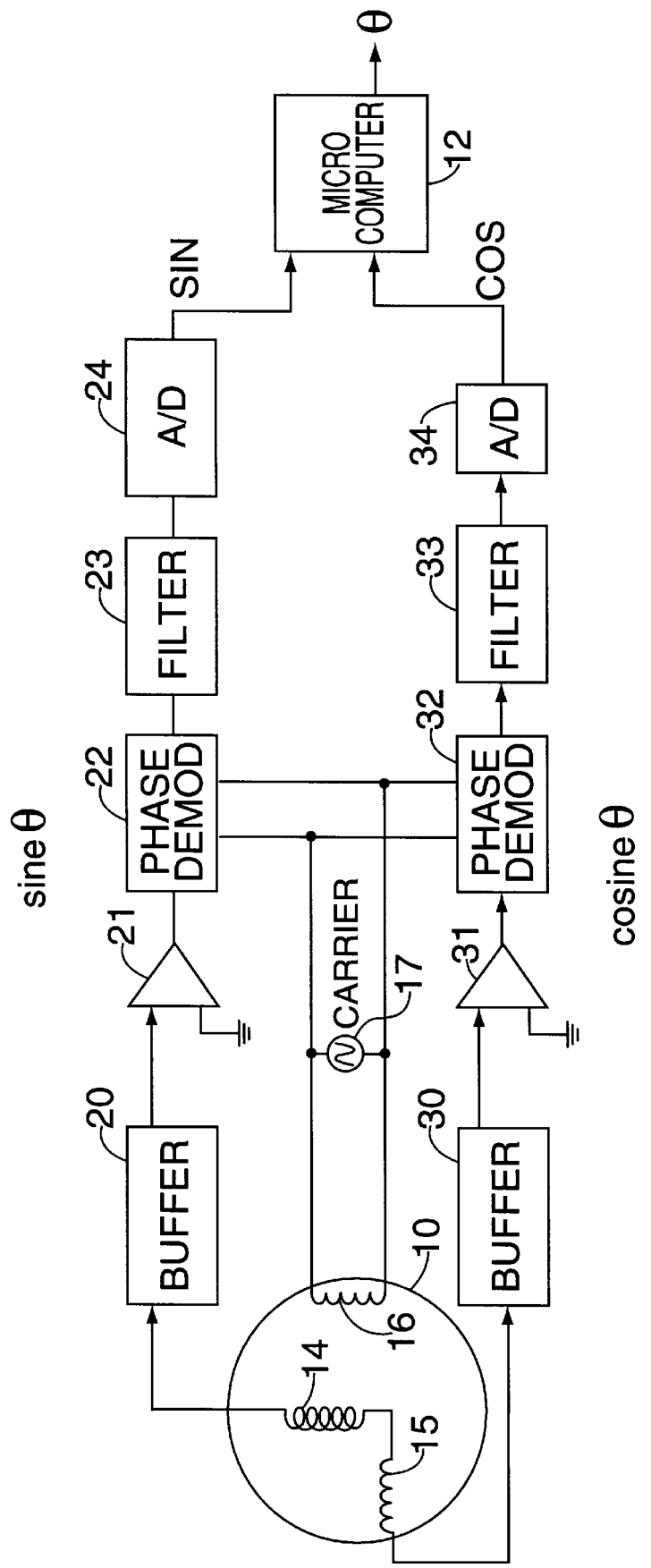
FIG. 1 is a block diagram of the resolver and associated units for processing the resolver signal and supplying same to a microcomputer.

The hardware portion of the system according to the invention is illustrated in FIG. 1 including a resolver 10 and microcomputer 12. The resolver produces the signals sine θ and cosine θ where θ is the resolver shaft angle position. The signals from the resolver are processed in the microcomputer using software functionally organized as shown in FIG. 2 to determine shaft angle θ as well as shaft velocity.

Resolver 10 includes a rotational primary winding 16 and a pair of stationary secondary windings 14 and 15. Windings 14 and 15 have a quadrature relationship to produce sine θ and cosine θ signals respectively. The primary winding is excited from a carrier frequency source 17 which is typically in the range between 1 KHz and 20 KHz. In most cases the higher frequencies are preferred. The amplitude of the signals induced in secondary windings 14 and 15 are proportional to sine θ and cosine θ respectively. The modulated signal sine θ passes through a voltage buffer 20 (typically in the form of a voltage follower) and then through a differential amplifier 21 connected to the common signal ground for the system. The buffer and differential amplifier combination connected to the common signal ground provides good noise rejection. The signal then passes through a phase demodulator 22 which removes the carrier leaving the envelope which is sine θ. The signal from the phase demodulator passes through a filter 23 which rejects the carrier frequency and passes the signal on to analog-to-digital converter 24. The signal emerging from the A/D converter is designated SIN and is a 12-bit digital indication corresponding to the analog value sine θ.

In similar fashion the cosine θ signal originating from resolver winding 15 is processed through units 30–34 to provide the digital value of cosine θ which is referred to as COS. The COS signal is supplied to microcomputer 12. For most systems sampling of the analog signals in analog-to-digital converters 24–34 is typically accomplished at the rate of at least one sample per millisecond. The SIN and COS values are stored at designated memory locations in microcomputer 12.

Figure 2:
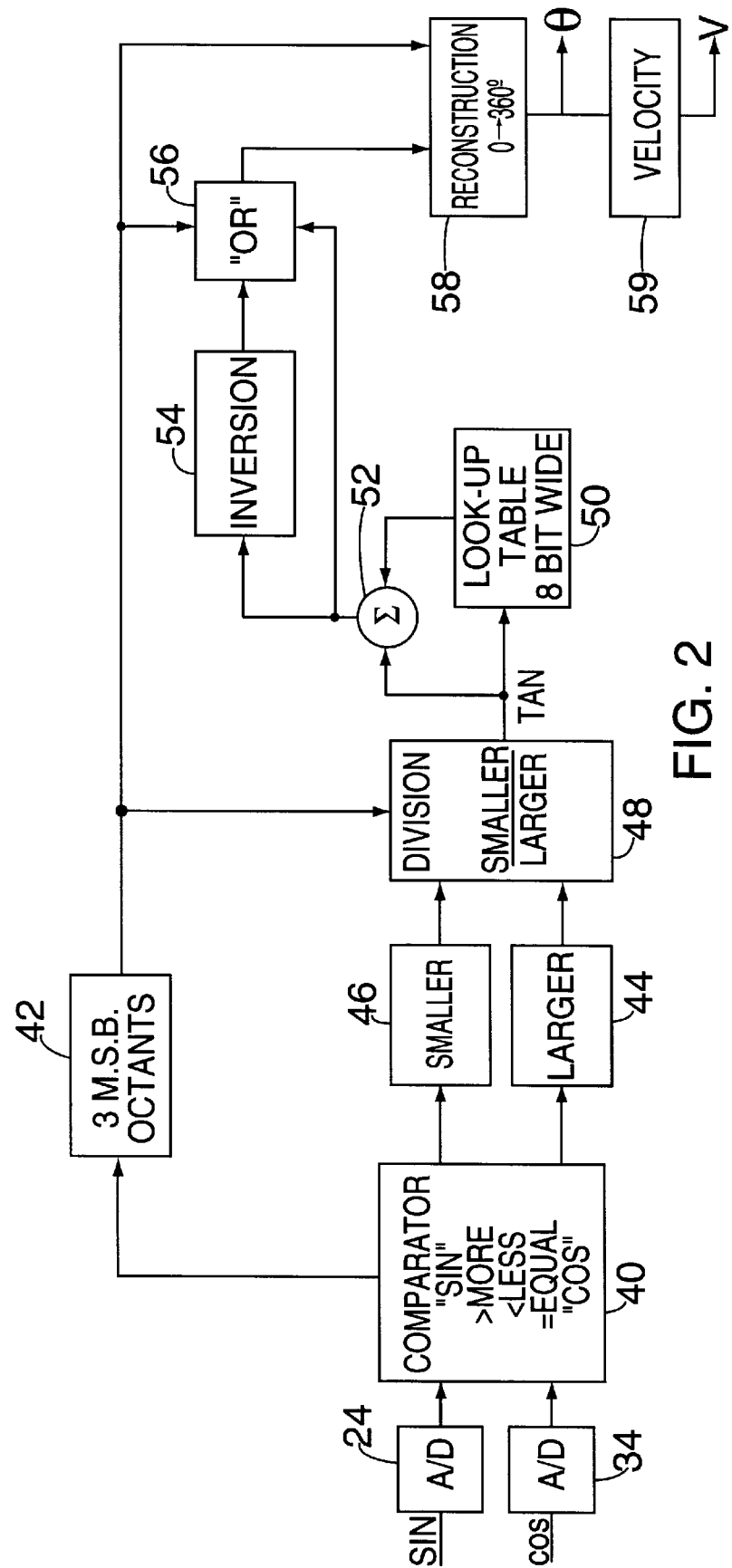
FIG. 2 is a functional diagram illustrating the computer processing of the resolver output signals.

As illustrated in FIG. 2, the processing of the SIN and COS values to determine the resolver angle θ includes (1) determining the octant for the angle θ, (2) determining the tangent value, (3) correcting the tangent value to obtain a linear value for the angle θ, and then (4) determining the angle θ by combining the octant and linear values. The octant is determined by the comparison of the polarities of the SIN and COS values and their relative magnitudes. In determining the tangent values it is necessary to avoid calculations that would cause the tangent value to go to infinity. This is achieved by always dividing the smaller of the absolute values of SIN and COS by the larger value. Over the 45° span of the octant the tangent values range from zero to one. The tangent values are close to the linear values for the angle θ and are corrected using a look-up table. The final value for the angle θ is then determined by using the octant to provide the three most significant bits and the corrected tangent value for the lesser bits.

At exactly 45°, for example, the SIN and COS values are equal and can be placed in either octant I or octant II. In cases where the values are equal it makes no difference which octant is used so long as the remainder of the processing is consistent with the octant determination.

Figure 4A:
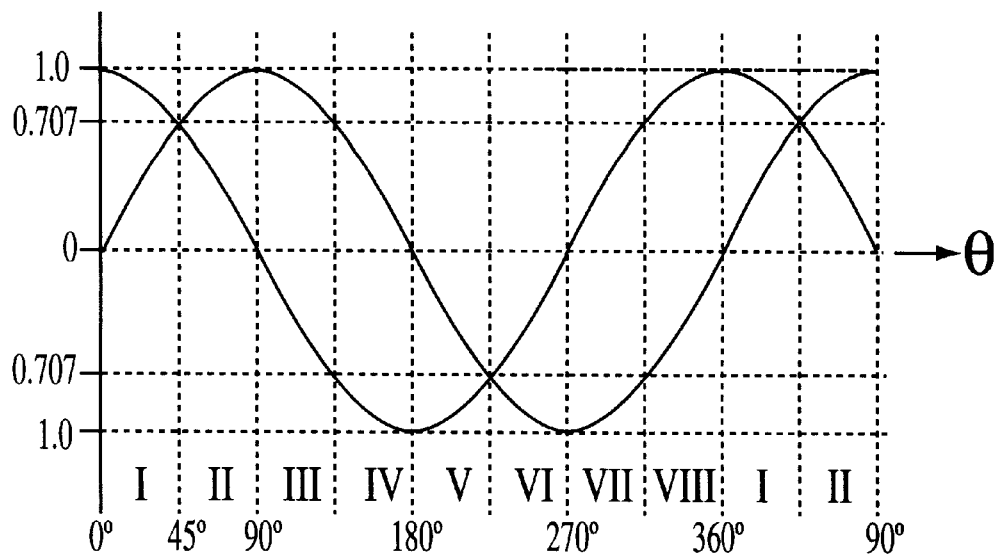
FIGS. 4A through 4H are illustrations of computer processing using sine and cosine signals from the resolver to determine the shaft angle θ.

More specifically, the analog sine θ and cosine θ signals pass through analog-to-digital converters 24 and 34 which provide 12-bit digital words corresponding to the SIN and COS values, respectively. The SIN and COS values are compared in comparator operation 40 to determine the polarity and the relative magnitudes. For example, as shown in the Octants Table in FIG. 3A, if the SIN and COS values are both positive and the absolute value of the SIN value is not greater than the COS value, the resolver angle θ is in the first octant I (000). Similarly, if the SIN and COS signals are both positive and the SIN value is greater, the resolver angle is in the second octant II (001). Other octants are determined in similar fashion following the logic in the Octants Table. The locations of the octants relative to the SIN and COS values are shown in FIG. 4A. The 3-bit octant identifier is stored in memory 42 (FIG. 2).

Figure 4B:
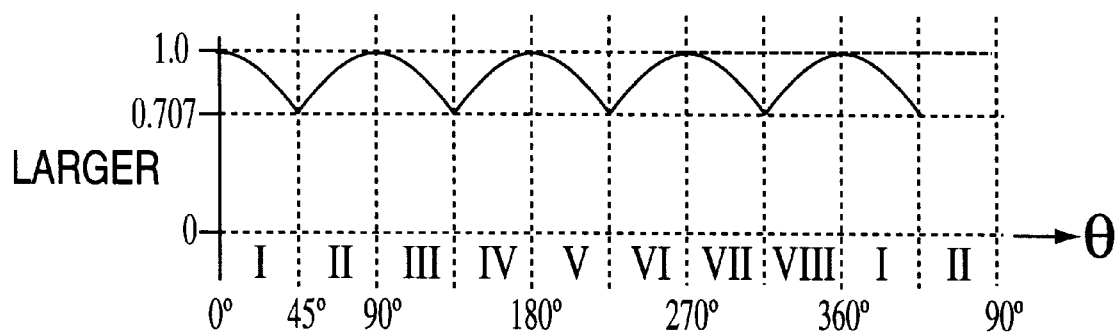
Figure 4C:
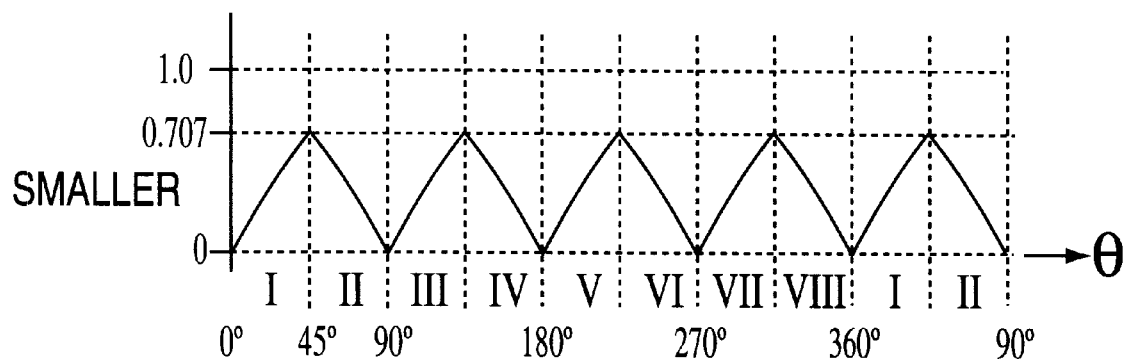

The comparison in comparator operation 40 also determines if the absolute SIN and COS values are greater or less than 0.707. If the value is greater than 0.707, it is stored in a "larger" memory 44, whereas if the value is less than 0.707, it is stored in a "smaller" memory 46. The "larger" and "smaller" values for the different resolver angles are shown in FIGS. 4B and 4C, respectively. Next, the "smaller" value is divided by the "larger" value in division operation 48 to obtain the TAN value shown in FIG. 4D. By always dividing by the larger of the SIN and COS values, the TAN values are always between zero and one. Tangent values between one and infinity are avoided.

Figure 4D:
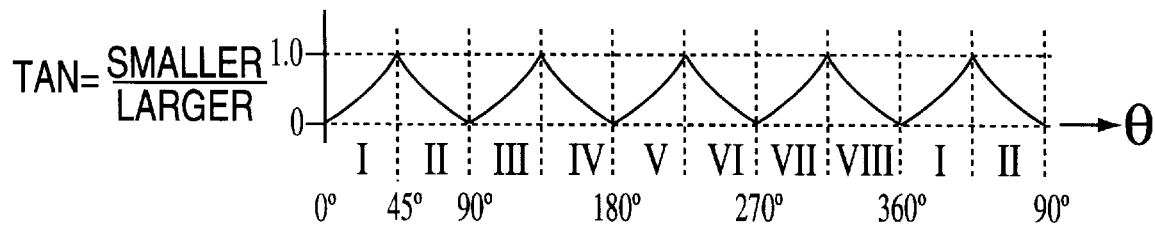
Figure 4E:
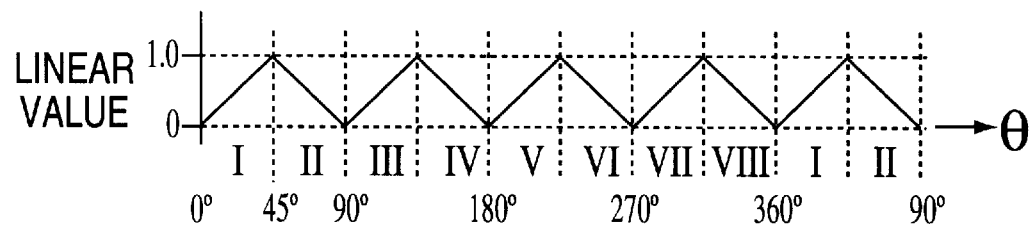
Figure 4F:
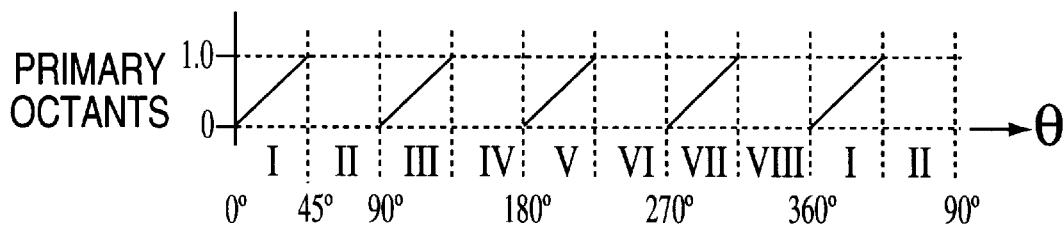
Figure 4G:
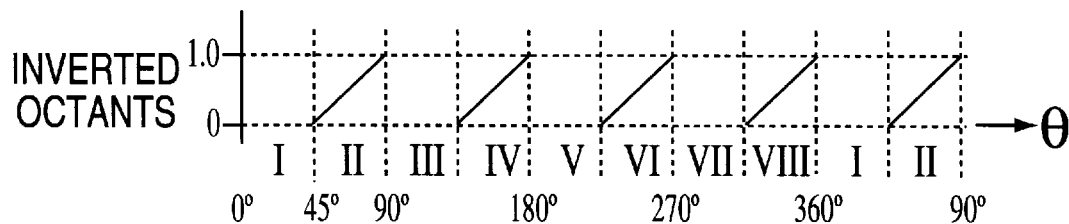
Figure 4H:
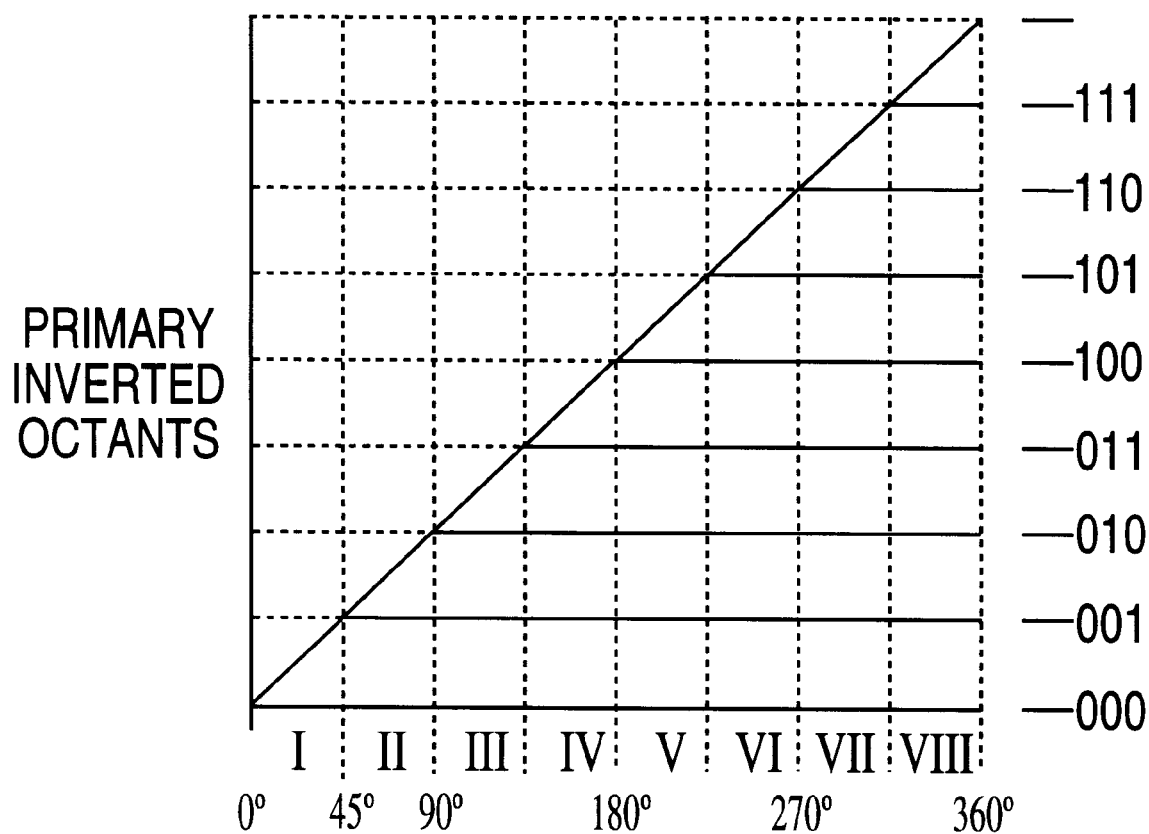

As shown in FIG. 4D, the TAN values within an octant, 0 to 45 degrees for example, are close to a linear relationship for the resolver angles. The deviation from the linear values is less than 7% and can be corrected using the 8-bit look-up table 50 in FIG. 1. The look-up table value is added to the TAN value in summation 52 to derive the linear values shown in FIG. 4E. For most installations linear 11-bit values are sufficient. The linear values are inverted using inversion routine 54. The linear values are used and passed through OR logic 56 for the odd octants, whereas the inverted linear values are used for the even octants.

In the final reconstruction 58 for the angle θ value, the octant 3-bit code value is used as the most significant three bits and added to the linear or inverted linear values as the 11 least significant bits. The resolver angle θ emerges as 14-bit code value covering the range from zero to 360 degrees in 16,384 increments.

The velocity is determined in a routine 59 which determines the difference in the angle θ for two successive samples.

While only one illustrative embodiment has been described in detail, it should be obvious that there are many variations within the scope of this invention which is more particularly defined in the appended claims.

I claim:

1. Apparatus for determining the shaft angle position θ of a resolver from the sine and cosine values produced by a resolver, comprising:
   (a) means for converting the resolver sine and cosine values into SIN and COS digital values;
   (b) means for determining the octant for the angle θ in 3-bit code from said SIN and COS values;
   (c) means for dividing the smaller of the SIN and COS absolute values by the larger of the SIN and COS values to derive a TAN value;
   (d) means for linearizing said TAN value;
   (e) means for inverting linearized values for even octants; and
   (f) means for thereafter adding said octant code as the most significant bits to said linearized values as the least significant bits.

2. Apparatus according to claim 1 wherein said means for determining the octant determines the SIN and COS polarity and determines which of said SIN and COS has the larger absolute value to uniquely identify the octant for the angle θ.

3. Apparatus according to claims 1 or 2 wherein said means for linearizing said TAN value employs a look-up table.

4. A method for determining the shaft angle position θ of a resolver from the sine and cosine values produced by a resolver, including the steps of:
   (1) converting the resolver sine and cosine values into SIN and COS digital values;
   (2) determining the octant for the angle θ in 3-bit code from said SIN and COS values;
   (3) dividing the smaller of the SIN and COS absolute values by the larger of the SIN and COS values to derive a TAN value;
   (4) linearizing said TAN value;
   (5) inverting linearizing values for even octants; and
   (6) thereafter adding said octant code as he most significant bits to the linearized values as the least significant bits to obtain the angle θ.

5. The method according to claim 4 wherein said octant is determined according to the polarity of said SIN and COS values and according to which of said SIN and COS values has the larger absolute value.

6. The method according to claims 4 or 5 wherein said TAN value is linearized using a look-up table.

7. The method according to claim 4 wherein the processing in steps 3 to 6 is in accord with octant determination in step 2.

\* \* \* \* \*